United States Patent
Johansson et al.

(10) Patent No.: US 6,852,638 B2
(45) Date of Patent: Feb. 8, 2005

(54) SELECTIVE BASE ETCHING

(75) Inventors: Ted Johansson, Djursholm (SE); Hans Norström, Solna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/757,092

(22) Filed: Jan. 14, 2004

(65) Prior Publication Data

US 2004/0157455 A1 Aug. 12, 2004

Related U.S. Application Data

(63) Continuation of application No. PCT/SE02/01361, filed on Jul. 9, 2002.

(30) Foreign Application Priority Data

Jul. 18, 2001 (SE) .............................................. 0102560
Nov. 28, 2001 (SE) .............................................. 0103980

(51) Int. Cl.[7] .......................................................... H01L 21/302
(52) U.S. Cl. ....................................... 438/710; 438/350
(58) Field of Search ................................. 438/710, 350, 438/309; 257/388

(56) References Cited

U.S. PATENT DOCUMENTS

| | | | | |
|---|---|---|---|---|
| 4,988,632 A | | 1/1991 | Pfiester ........................ 437/31 |
| 5,213,989 A | | 5/1993 | Fitch et al. ..................... 437/31 |
| 5,217,564 A | * | 6/1993 | Bozler et al. ................ 438/107 |
| 5,266,504 A | | 11/1993 | Blouse et al. .................. 437/31 |
| 5,431,777 A | * | 7/1995 | Austin et al. ................. 438/753 |
| 5,484,740 A | * | 1/1996 | Cho ............................ 438/167 |
| 5,502,330 A | | 3/1996 | Johnson et al. .............. 257/588 |
| 5,592,017 A | | 1/1997 | Johnson ....................... 257/554 |
| 5,600,174 A | * | 2/1997 | Reay et al. .................... 257/467 |
| 5,616,508 A | | 4/1997 | Johnson ....................... 438/350 |
| 5,817,580 A | * | 10/1998 | Violette ........................ 438/756 |
| 6,077,752 A | | 6/2000 | Norström ..................... 438/309 |
| 6,255,183 B1 | | 7/2001 | Schmitz et al. .............. 438/309 |
| 6,261,964 B1 | * | 7/2001 | Wu et al. ..................... 438/705 |

FOREIGN PATENT DOCUMENTS

| | | | |
|---|---|---|---|
| SE | 0103726-6 | 7/2003 | ......... H01L/21/331 |
| WO | WO 97/19465 | 5/1997 | ......... H01L/21/316 |

OTHER PUBLICATIONS

B. Tillack et al; "Monitoring of deposition and dry etching of Si/SiGe multiple stacks"; J. Vac. Sci. Technol. B14(I)9, pp. 1184–1198, Jan./Feb. 1996.

(List continued on next page.)

*Primary Examiner*—John F. Niebling
*Assistant Examiner*—Olivia Luk
(74) *Attorney, Agent, or Firm*—Baker Botts L.L.P.

(57) ABSTRACT

A method for selective etching in the manufacture of a semiconductor device comprises: forming a layer (6) of silicon-germanium on a substrate (1) of monocrystalline silicon or on a substrate at least comprising a surface layer of monocrystalline silicon, depositing at least a dielectric layer (7) on the silicon-germanium layer (6) and patterning the resultant structure (8), whereafter the dielectric layer (7) and the silicon-germanium layer (6) are etched away within a predetermined region (9). Preferably, the silicon-germanium layer (6) is amorphous, whereby the dielectric layer (7) is deposited on the amorphous silicon-germanium layer (6) in such a manner to prevent crystallization of the amorphous layer. After etching the structure may be heat-treated such that the amorphous layer crystallizes. The method is preferably applicable for etching an emitter window in the manufacture of a bipolar transistor having a self-registered base-emitter structure.

31 Claims, 2 Drawing Sheets

OTHER PUBLICATIONS

Tsu–Jae King et al.; "A Polycrystalline–$Si_{1-x}Ge_x$–GATE CMOS Technology"; Center for Integrated Systems, Stanford University, Stanford, CA, Apr. 1990.

E. Josse, et al; "High performance 0.1 $\mu$pMOSFETs with optimized poily–Si and poly–SiGe gates".

J.A. Babcok et al.; "Precision electrical Trimming of Very Low TCR Poly–SiGe Resistors" IEEE Electron Device Letters. vol. 21, No. 6, Jun., 2000.

S. Wolf et al.; "for the VLSI Era"; vol. 1—Process Technology; p. 565–567.

D. L. Harame; et al.; "Si/SiGe Epitaxial–Base Transistors–Part II: Process Integration and Analog Applications" IEEE Transactions on Electron Devices, vol. 42, No. 3, Mar. 1995.

T.H. Ning, et al.; "Self–Aligned NPN Bipolar Transistors"; International Electron Devices Meeting; Washington, D.C., Dec. 1980.

* cited by examiner

SELECTIVE BASE ETCHING

CROSS REFERENCE TO RELATED APPLICATION

This application is a continuation of copending International Application No. PCT/SE02/01361 filed Jul. 9, 2002 which designates the United States, and claims priority to Swedish application no. 0102560-0 filed Jul. 18, 2001 and Swedish application no. 0103980-9 filed Nov. 28, 2001.

TECHNICAL FIELD OF THE INVENTION

The present invention relates to a method of etching selectively when manufacturing a semiconductor device and to a method in the manufacturing of a bipolar transistor while applying said method of etching selectively.

DESCRIPTION OF THE RELATED ART

The trend in design and manufacture of integrated circuits leans towards progressively smaller individual components of progressively higher performance. The dimensions of bipolar transistors are e.g. becoming progressively smaller, both horizontally and vertically, so as to increase the packing density and transistor speed. The manufacturing precision has therewith become progressively more important, both with regard to individual process steps and with regard to alignment of different layers.

In the manufacture of bipolar high frequency transistors there is today normally used a technique that employs a self-registered base-emitter structure (T. H. Ning et al. "Self-aligned npn bipolar transistors" IEDM Techn. Dig., pages 823–824, 1980), which enables the transistor cell to be made smaller while obtaining a reduced base collector capacitance and a reduced base resistance when the extrinsic base is connected to the intrinsic base in the immediate proximity of the emitter. Several variants of this method are known in the art.

U.S. Pat. No. 5,266,504 describes a method of manufacturing a self-registered bipolar transistor, in the which the base is grown epitaxially and the emitter is formed by deposition of an amorphous silicon layer followed by deposition of a polycrystalline silicon layer, whereafter the structure is patterned and etched. The amorphous silicon layer is then recrystallized by SPE (Solid Phase Epitaxy). This method is able to provide a thin base and a sharp and well-controlled emitter-based junction.

U.S. Pat. No. 4,988,632 teaches deposition of a polycrystalline or amorphous silicon layer on a substrate and doping of the layer. A layer of LTO (Low Temperature Oxide) or some other dielectric is deposited on said silicon layer, whereafter the structure is patterned and etched to provide a base electrode and emitter opening. In U.S. Pat. No. 5,213,989 is discussed that a layer, which may be of polycrystalline silicon, amorphous silicon or another silicon-based material, is deposited on a substrate and doped, whereafter a dielectric layer, preferably a TEOS-based (Tetra Ethyl Ortho Silicate-based) oxide is deposited over the silicon layer. The structure is patterned and etched in a known manner.

Those problems that occur when etching selectively a polycrystalline silicon layer from a silicon substrate involve difficulties in stopping the etching process so that the polycrystalline silicon layer is removed completely without etching the substrate too deeply. In U.S. Pat. No. 5,616,508 is depicted how this problem can be reduced by introducing an etch-stopping layer in the structure so that the etching can be stopped in a first step towards the etch-stopping layer, whereafter further etching carefully removes the etch-stopping layer to reach the silicon substrate. In U.S. Pat. No. 5,502,330 this concept is further developed by employing a further etch-stopping layer.

A further aspect is that the polycrystalline silicon layer is etched with different rates along different crystal directions and in grain boundaries resulting in etching residues, so-called pillars, or in irregularities in the etch surface, so-called facets, and in blunt or dull edges in the etched openings. There are also other aspects on polycrystalline silicon layers, which are discussed in WO-9719465 and in U.S. Pat. No. 6,077,752 and it is disclosed therein the advantages obtained by selecting the deposited silicon layer structure to be amorphous. Such silicon lacks crystal structure and in such a manner many of the problems and drawbacks in the use of polycrystalline silicon are removed.

Nevertheless the etching selectivity for etching amorphous silicon on monocrystalline silicon may in some instances be too low. Typically, a certain degree of overetching down into the substrate is allowed but in the manufacture of bipolar transistors having an epitaxially formed base such overetching is not allowed and, thus, the etching selectivity may be insufficient.

SUMMARY OF THE INVENTION

The object of the present invention is to resolve the above problems and thus being able to produce semiconductor components, particularly bipolar transistors, of higher quality and/or higher performance and/or of smaller size than those semiconductor components produced by hitherto known methods.

To this end the inventive method includes the etching of deposited silicon-germanium layers, which have high selectivity towards monocrystalline silicon. Thus, many of the problems and drawbacks of etching polycrystalline or amorphous silicon on monocrystalline silicon are removed.

The inventive method involves forming a layer of silicon-germanium on a crystalline silicon substrate, which may be a bulk substrate, optionally with one or several epitaxial layers formed thereon, and optionally being doped and/or containing germanium.

The silicon-germanium layer is deposited preferably by UHV-CVD (Ultra High Vacuum-Chemical Vapor Deposition), RP-CVD (Reduced Pressure-Chemical Vapor Deposition) or MBE (Molecular Beam Epitaxy). The silicon-germanium layer can be formed by simultaneous deposition of silicon and germanium or by deposition of silicon and a subsequent implantation of germanium. Preferably, the silicon-germanium layer formed has a germanium content of between 5 and 60%, more preferably between 10 and 55% and most preferably between 30 and 50% (the percentages denote atomic percentages). Further, the silicon-germanium layer may be formed as a multilayer structure, wherein each layer has an individual material composition and possibly doping.

Further, according to the invention a protecting layer of a dielectric is deposited onto this silicon-germanium layer. Preferably, the dielectric is deposited by any of the following methods: PE-CVD (Plasma Enhanced Chemical Vapor Deposition), SA-CVD (Sub Atmospheric Chemical Vapor Deposition), HDP-CVD (High Density Plasma Chemical Vapor Deposition), MBE or with the aid of a spin-on technique. The dielectric layer is preferably comprised of PETEOS (Plasma Enhanced Tetra Ethyl Ortho Silicate).

The resultant structure is patterned, whereafter the dielectric layer and the silicon-germanium layer are etched, preferably dryetched, within a predetermined area. During the etching, end point detection of germanium, e.g. performed by means of emission spectroscopy, may be performed to accurately control the etching of the silicon-germanium layer.

Preferably, the silicon-germanium is deposited at a temperature such that the layer is deposited as an amorphous layer, whereby the dielectric layer is deposited onto the amorphous silicon-germanium layer in such a manner that the amorphous layer does not crystallize. Subsequent to etching the structure may be heat-treated so that the amorphous layer crystallizes.

The inventive etching method provides structures, which have sharply defined edges and smooth pronounced etch surfaces in absence of pillar or facet formation tendencies. Further, good etching selectivity between the silicon-germanium and the crystalline silicon is obtained. This results in semiconductor components of improved performance in relation to earlier produced semiconductor components.

Particularly when manufacturing a bipolar transistor having a self-registered base emitter structure the above etching process can be employed when etching the emitter opening and in such a manner semiconductor devices of very small dimensions (length scales in the submicrometer range) can be produced. The advantages obtained with the present method include good etching selectivity when etching silicon-germanium on crystalline silicon, good CD control (Critical Dimension control), i.e. good control of the dimensions of the etched emitter opening, and avoidance of the risk for channeling of dopants.

Silicon-germanium may advantageously also be employed as a material for integrated resistors on the surface of the integrated circuit.

BRIEF DESCRIPTION OF THE DRAWINGS

The invention will now be described more in detail with reference to the accompanying drawings, in which.

DETAILED DESCRIPTION OF THE PREFERRED EMBODIMENTS

Figure 1:
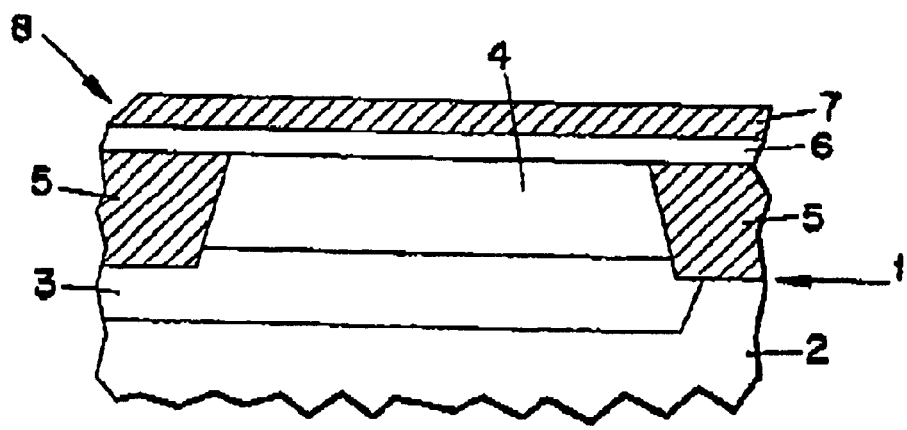
FIGS. 1 and 2 are cross-sectional views illustrating two inventive method steps when etching a silicon-germanium layer on a silicon surface.

Shown in FIG. 1 is a silicon substrate 1, wherein the silicon may be monocrystalline, polycrystalline or microcrystalline but is preferably monocrystalline. As in FIG. 1 the substrate 1 may have various defined regions 2–5, which will be described below more in detail. Such regions may include a doped region, particularly a region doped with boron, and/or a region containing germanium. The substrate may alternatively be homogeneous. Any surface oxide present on the substrate 1, possibly having a thickness of some nanometers, can be removed by conveniently dipping the substrate in an HF bath or in an HF vapor.

In accordance with the invention there is deposited a layer 6 of silicon-germanium on the substrate 1 to a thickness of some hundreds of nanometers, preferably by employing RP-CVD technique typically in a temperature interval of 500–550 C. The exact temperature to achieve the desired layer structure will depend on the germanium concentration and level of in-situ doping of dopants. The silicon-germanium may alternatively be deposited at another temperature and/or by employing some other technique, such as UHV-CVD or MBE. In order to achieve good etching selectivity a proportionally high germanium content (30–50 atomic percent) in the layer is preferably selected. The silicon-germanium layer is preferably deposited as an amorphous layer but may alternatively be deposited as a polycrystalline layer. Conveniently, silicon and germanium are deposited simultaneously but alternatively a silicon layer, with thickness of some nanometers, may first be deposited as a "seed layer", whereafter a silicon-germanium film is the deposited. Still another alternative is to first deposit a silicon layer, whereafter germanium is implanted into the silicon layer.

References discussing deposited layers of $Si_xGe_{1-x}$ include i. a. King et al., IEDM Tech Dig. 1990, p. 25, E. Josse et al., Proc. ESSDERC 2000, Babcock et al., IEEE Electron Device Letters. p. 283, June 2000 and U.S. Pat. No. 5,592,017. The former documents relate to the use of silicon-germanium in the manufacture of MOS transistors and the latter one discusses silicon-germanium for resistors in integrated circuits. The above documents are hereby incorporated by reference.

The silicon-germanium layer 6 may optionally be doped. Most advantageously, the silicon-germanium layer is deposited containing p-type dopants. The available deposition techniques easily admit that the layer can alternatively consist of a stack of different layers having different material composition and dopants.

It is alternatively possible to dope through ion implantation, wherein, by the choice of amorphous silicon-germanium, channeling of the dopant in grain boundaries and crystal directions is avoided. Typical p-type dopants suitable for ion implantation are in this instance $B^{11}$ or $BF_2$.

In accordance with the invention there is deposited on the silicon-germanium layer 6 a protective dielectric layer 7. If the silicon-germanium layer 6 is amorphous the protective dielectric layer 7 is deposited so as to prevent crystallization of the silicon-germanium layer 6. This is ensured when the dielectric layer 7 is deposited at a temperature of about 400° C. and during a relatively short period of time. The so-called single wafer technique is preferably used in this regard, i.e. a technique in which one wafer is processed at a time, which gives shorter deposition times. Examples of such techniques at present are PE-CVD, SA-CVD, HDP-CVD, MBE and the spin-on technique.

The dielectric layer 7 may be comprised of a nitride or an oxide, although it will preferably be a silicate. Conveniently, the silicate is PETEOS, i.e. TEOS (Tetra Ethyl Ortho Silicate), deposited by PE-CVD. This results in a high quality layer of low particle density and porosity and also affords a good control over the layer thickness. The dielectric layer 7 shall be deposited to a thickness in the order of some hundreds of nanometers. A preferred deposition temperature is between 250 and 400° C. Although not shown, one or more additional dielectric layers may be deposited on the structure.

The structure, referenced 8 in FIG. 1, is then patterned by a conventional photolithographic process, whereafter the possibly superimposed additional dielectric layers (not shown), the dielectric layer 7 and the silicon-germanium layer 6 are removed within a predetermined region or area 9 in an etching step. The upper side of the substrate 1 is thus exposed within the region 9.

The dielectric layer 7 may be etched using an anisotropic dryetching process, e.g. using a $CHF_3/O_2$ or a $C_2F_6$ plasma.

The silicon-germanium layer 6 is preferably etched according to the invention by a dry-etching process, which may be anisotropic, e.g. using an HBr and/or $Cl_2$-based plasma, but preferably using an $SF_6/O_2$ plasma or alternatively an $SF_6/$HBr plasma, which results in a very good selectivity towards underlying layers.

If the silicon-germanium layer is amorphous, it lacks macroscopic crystal structure, is rich in defects and has therefore greater free energy than polycrystalline and monocrystalline silicon. It is thus possible to achieve good etching selectivity between amorphous material and monocrystalline silicon, see U.S. Pat. No. 6,077,752.

It is possible to etch away all amorphous silicon-germanium without etching deep down into the substrate. When etching amorphous silicon-germanium no undesirable etching is obtained along grain boundaries or crystal surfaces, therewith resulting in smooth etched surfaces. When overetching the underlying monocrystalline silicon, a smooth surface is obtained in the absence of replica of the grain structures, so-called reproduction of facets or crystal grains or residual crystal grains, so-called pillars, as would possibly be the case when etching polycrystalline or microcrystalline silicon. Furthermore, an opening that is etched out in amorphous silicon-germanium will have sharper edges and smoother sidewalls than the corresponding opening that is etched out in polycrystalline silicon. It is highly important to achieve good CD control, i.e. control over the dimensions of the etched opening, particularly when manufacturing semiconductor devices within the submicrometer range, such a control being achieved when etching in amorphous silicon-germanium.

Nevertheless, there is in many applications a satisfactory etching selectivity also between polycrystalline silicon-germanium and monocrystalline silicon.

Another method to improve etching selectivity is to use end-point detection. The length of the dry-etching process, i.e. the etching time, for the etching of the silicon-germanium layer 6 can be determined by means of optical spectroscopy (so called end-point detection) in real time by monitoring emission lines from the etching plasma.

When the silicon-germanium layer 6 is etched away, particularly in a reactive ion etch (RIE), chemical reactions of the gases in a plasma take place, which produce ions that are accelerated towards the semiconductor surface. Germanium, which is etched away, takes part in these reactions and as a result volatile germanium compounds are formed, which are transported away from the semiconductor surface. When germanium is no longer detected, the semiconductor surface is free from germanium and the endpoint is found. End-point detection is described in e.g. S. Wolf and R. N. Tauber, "Silicon Processing for the VLSI Era, Volume 1—Process Technology" pp. 565–568, Lattice Press, Sunset Beach, 1986, which text hereby is incorporated by reference.

Possibly, the etching is continued a short additional time after the end-point has been detected in order to safeguard that the silicon-germanium layer 6 is etched away completely. Typically, such time period last a couple of seconds. Nevertheless, a much less degree of overetching may be performed using end-point detection than if a conventional time-based etching would be performed (etching during a predetermined time period based on layer thickness and estimated etching rate, to which 15–30% additional time is added to make sure that the layer is removed completely).

End-point detection is preferred in this respect since a better control of the etching process is obtained. Further, end-point detection requires less prior knowledge of the structure to be etched and of the etch rate. Thus, end-point detection is better to manage variations in layer thickness and in etching parameters.

Further, as an alternative to continue etching a short additional time after the end-point has been detected in order to safeguard that the silicon-germanium layer 6 is etched away completely, the structure may be etched a short time using a wet etch chemistry.

Still further, the end-point detection can additionally or alternatively be used to trigger an alteration of applied etching conditions, such as pressure, gas composition, and bias, to achieve a higher selectivity in the process.

The process of using end-point detection can be used in yet another manner if the deposited SiGe-layer 6 contains a stack of multiple silicon layers, with a thin layer containing germanium close or closest to the interface where the etching is to be stopped, i.e. the substrate surface. This layer may have a thickness of only a few tens of nanometers, and may contain a large fraction of germanium (typically in the order of 30%). On top of this layer, a thicker layer of silicon, optionally containing p-type dopant such as boron, as discussed above, is deposited.

During etching, a distinct germanium compound signal, using the previously described end-point detection system, will be achieved when the etching reaches down to the thin layer containing germanium. The etching will preferably be continued until the germanium compound signal declines (possible with some additional etching time before the etching is stopped).

The purpose of the thin Ge-layer is thus to function as a "marker" to indicate that the etching has reached the desired level in the multilayer stack.

According to the invention the above-described method steps can be used as a subprocess in the manufacturing of an npn-bipolar transistor having e.g. a self-registered base emitter structure.

Figure 2:
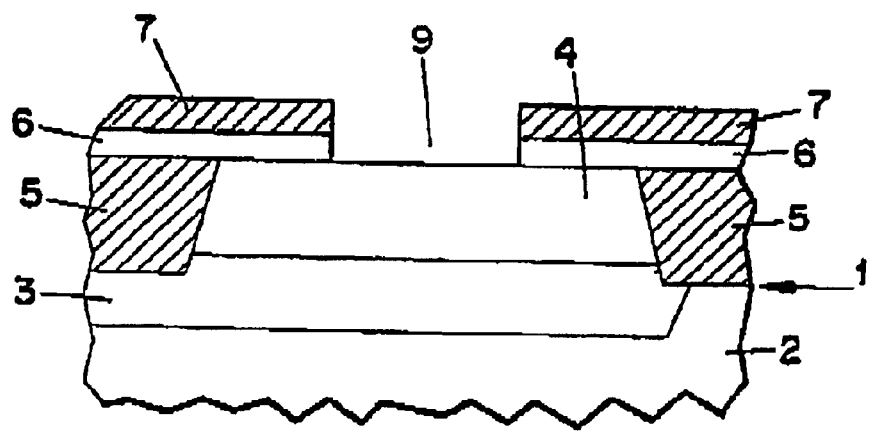

The method of manufacturing a bipolar transistor starts from the structure illustrated in FIG. 2 having defined regions 2–5, i.e. as seen from the bottom a p-doped region 2, an $n^+$-doped layer 3 for a collector electrode and nearest the surface an n-doped layer 4, which is surrounded by an electrically insulated region.

The window 9 shown in FIG. 2 will form an emitter opening, whereas the amorphous or polycrystalline silicon-germanium layer 6 will form an extrinsic base. The silicon-germanium layer may alternatively be formed simultaneously outside component areas on top of field oxide regions (such as those referenced 5 in FIGS. 1 and 2) for use as resistances having low temperature dependence (low Tc).

Figure 3:
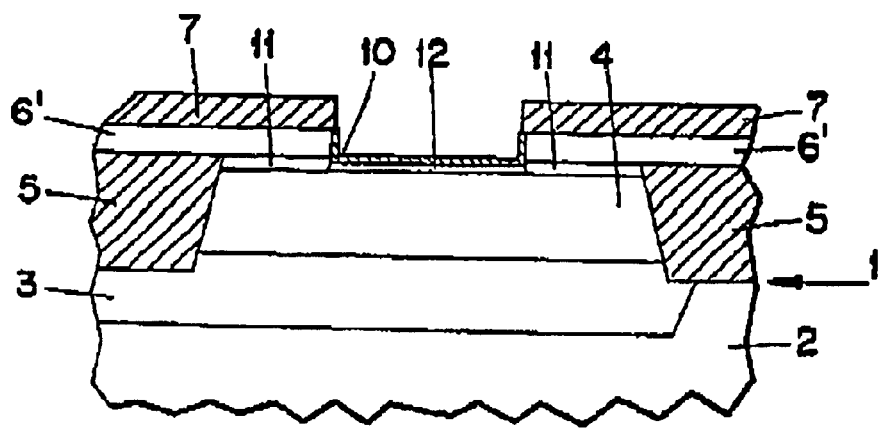
FIGS. 3–6 are cross-sectional views illustrating four inventive method steps during the manufacture of a bipolar transistor having a self-registered base emitter structure, starting from the structure illustrated in FIG. 2.

As shown in FIG. 3 there is then grown on the structure shown in FIG. 2 a thin thermal oxide layer 10 having a thickness of one or some tens of nanometers at such a temperature which would cause the silicon-germanium layer 6 if was amorphous to crystallize. Alternatively, the oxide layer is deposited as a TEOS, if so needed. The crystalline silicon-germanium layer is referenced 6' in FIG. 3. A suitable temperature range is in this regard 700–900° C. Parallel herewith dopants are driven into the substrate 1 from the doped crystalline silicon-germanium layer 6' to the formation of a doped region 11. A p-doped intrinsic base 12 is formed by ion implantation of e.g. B in the substrate 1 through the thin oxide layer 10. Alternatively, an epitaxially formed base layer may already exist on the wafer and in such a case no further implantation is needed. The $p^+$-doped region 11 enables an electrical contact between the intrinsic base 12 and the extrinsic base 6' to be obtained.

Figure 4:
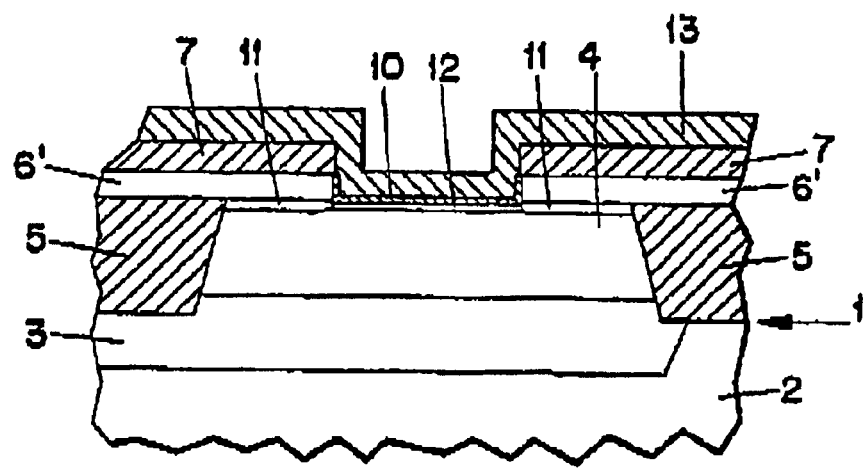

A layer 13 of an electrically insulating material is then deposited conformly over the structure of to FIG. 3. The layer 13 will preferably have a thickness of some hundreds of nanometers and will preferably consist of a nitride, e.g. silicon nitride, $Si_3N_4$, and be deposited by LP-CVD technique (Low Pressure Chemical Vapor Deposition). The resultant structure is shown in FIG. 4.

Figure 5:
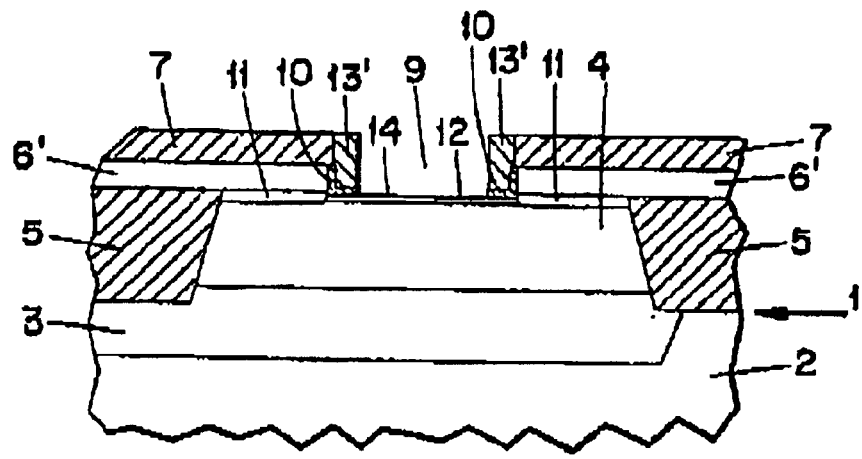

The nitride layer 13 is re-etched anisotropically in a plasma etching process until a thin oxide layer (not shown) remains on top of the substrate 1 in the emitter opening 9. A nitride string or a so-called nitride spacer 13 remains along the sidewalls of the emitter opening 9. The thin oxide layer (not shown) is then removed by a selective plasma etching process or a wet etching process, therewith exposing the substrate surface 14 in the emitter opening. The resultant structure is shown in FIG. 5. This structure is then dipped optionally in an HF bath or in an HF vapor to remove surface oxide; whereafter an emitter layer (not shown) of polycrystalline or amorphous silicon is deposited on the structure shown in FIG. 5. The emitter layer is deposited preferably to a thickness of some hundreds of nanometers and is $n^+$-doped, either in-situ during deposition, or later e.g. by implanting arsenic. The structure is then heat-treated, wherein the dopant (arsenic) is driven into the substrate 1 and forms an $n^+$-doped region 16. During the heat treatment boron diffuses down into the substrate, wherewith the extrinsic base becomes somewhat deeper, as appears from the region referenced 11' in FIG. 6. A very shallow emitter ($n^+$)-base (p) junction can be obtained by carrying out the method steps with precision and by carefully controlling the steps. The emitter layer (not shown) is patterned lithographically and plasma-etched in a conventional manner to define an emitter 15 in the emitter opening 9 as shown in FIG. 6.

Figure 6:
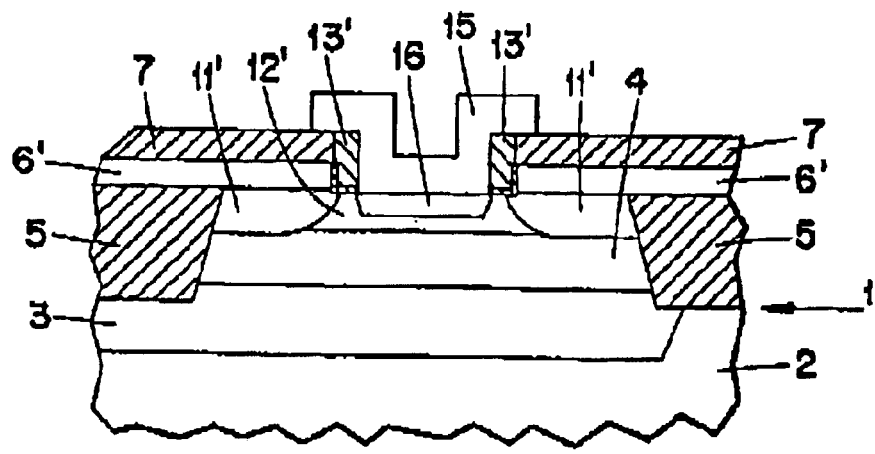

A further oxide layer is then optionally deposited on the structure shown in FIG. 6, whereafter the structure is patterned and etched to form contact holes.

It will be understood that the method described above can also be used in the manufacture of pnp transistors after changing the dopants. In this regard the silicon-germanium layer 6 and the intrinsic base 12 are then n-doped, whereas the collector 3, 4 and the emitter 15, 16 are p-doped.

Further, as an alternative to the formation of a p-doped intrinsic base 12 by ion implantation, the intrinsic base may, according to the present invention, be formed in a conventional SiGe-base process flow, see e.g. D. L. Harame et al., "Si/SiGe Epitaxial Base Transistors—Part II: Process Integration and Analog Applications", IEEE Transaction on Electron Devices, p. 469, Vol. 42, No. 3, 1995, whereafter the extrinsic base is formed as described above. The article by Harame et al. is hereby incorporated by reference.

As still a further alternative to the formation of a p-doped intrinsic base 12 by ion implantation of e.g. boron in the substrate 1 through the thin oxide layer 10, a mesa type of transistor may be formed. For additional details regarding such a transistor structure reference is given to our co-pending Swedish patent application No. 0103726-6 entitled "Silicon-germanium mesa transistor" and filed on Nov. 9, 2001, which application being hereby incorporated by reference.

The advantages that are afforded by the inventive method as described above include greater precision in the manufacture, the possibility of reducing dimensions, meaning lower base collector capacitance and lower base resistance of the transistor, and the avoidance of the risk of poor or no electrical contact between the intrinsic and extrinsic bases, as the emitter opening may be etched without the need of a powerful overetching procedure.

We claim:

1. A method for selective etching in the manufacture of a semiconductor device, comprising the steps of:
    forming a layer of amorphous silicon-germanium on a substrate of monocrystalline silicon or on a substrate at least comprising a surface layer of monocrystalline silicon by simultaneous deposition of silicon and germanium,
    depositing at least one dielectric layer on the amorphous silicon-germanium layer so as to prevent crystallization of the amorphous layer;
    patterning the resultant structure, and etching the dielectric layer and the amorphous silicon-germanium layer within a predetermined region; and
    heat-treating the resultant structure subsequent to etching so as to crystallize the amorphous layer.

2. The method as claimed in claim 1, wherein the amorphous silicon-germanium layer is formed with a germanium content of between 5 and 60 atomic percent, more preferably between 10 and 55 atomic percent and most preferably between 30 and 50 atomic percent.

3. The method as claimed in claim 1, wherein the silicon germanium layer is formed as a multilayer structure, wherein each layer has an individual material composition.

4. The method as claimed in claim 1, wherein the amorphous silicon-germanium layer is doped.

5. The method as claimed in claim 4, wherein the amorphous silicon-germanium layer is doped by ion implantation, preferably with $B^{11}$ or $BF_2$.

6. The method as claimed in claim 5, wherein the amorphous silicon-germanium layer is doped simultaneously as it is formed on the substrate.

7. The method as claimed in claim 1, wherein the amorphous silicon-germanium layer is formed on the substrate by using any one of the techniques CVD, RP-CVD, UHV-CVD and MBE.

8. The method as claimed in claim 1, wherein the dielectric layer is deposited by any one of the techniques PE-CVD, SA-CVD, HDP-CVD, MBE or a spin-on technique.

9. The method as claimed in claim 1, wherein the dielectric layer is a TEOS.

10. The method as claimed in claim 1, wherein the dielectric layer is deposited at a temperature of between 250 and 400° C.

11. The method as claimed in claim 1, wherein the amorphous silicon-germanium layer is etched within a predetermined region using a fluorine-or chlorine-based chemistry.

12. The method as claimed in claim 1, wherein the amorphous silicon-germanium layer is patterned and etched in order to produce a polyresistor having very low temperature dependence.

13. The method as claimed in claim 1, wherein said substrate of monocrystalline silicon is p-type doped, particularly with boron, and/or contains germanium.

14. The method as claimed in claim 1, wherein said etching of the amorphous silicon-germanium layer within the predetermined region is a dry etching process and wherein end-point detection of germanium is performed during the dry etching process to control the etching of the amorphous silicon-germanium layer.

15. The method as claimed in claim 14, wherein said end-point detection of germanium is performed by means of emission spectroscopy.

16. The method as claimed in claim 14, wherein said dry etching of the amorphous silicon-germanium layer within the predetermined region is ceased when end-point is detected.

17. The method as claimed in claim 15, wherein said etching of the amorphous silicon-germanium layer within the predetermined region is performed during a short time period, particularly a few seconds, after the end point has been detected in order to safeguard that said layer of amorphous silicon-germanium is etched away completely.

18. The method as claimed in claim 16, further comprising the step of wet etching the amorphous silicon-germanium layer within the predetermined region subsequent to completion of the dry etching process in order to safeguard that said layer of amorphous silicon-germanium is etched away completely.

19. The method as claimed in claim 14, wherein applied etching conditions, particularly parameters such as pressure, gas composition, and bias, during said dry etching of the amorphous silicon-germanium layer within the predetermined region are altered when end-point is detected.

20. The method as claimed in claim 14, wherein said layer of amorphous silicon-germanium is formed as a multilayer structure, wherein one of the layers closest to the substrate contains germanium, and wherein said performed endpoint detection of germanium is used to detect that said dry etching process has reached to a level in the multilayer structure corresponding to said layer containing germanium.

21. A method in the manufacture of a bipolar transistor having a self-registered base emitter structure, comprising the steps of:
forming a layer of amorphous silicon-germanium on a substrate of monocrystalline silicon or on a substrate at least comprising a surface layer of monocrystalline silicon,
depositing at least one dielectric layer on the amorphous silicon-germanium layer so as to prevent crystallization of the amorphous layer;
patterning the resultant structure, and etching the dielectric layer and the amorphous silicon-germanium layer within a predetermined region; and
heat-treating the resultant structure subsequent to etching so as to crystallize the amorphous layer,
wherein the substrate includes a buried collector and an epitaxially formed base thereon surrounded by isolation regions, where said predetermined area, within which the dielectric layer and the amorphous silicon-germanium layer are etched, defines an emitter opening above said epitaxially formed base for the bipolar transistor.

22. The method as claimed in claim 21, wherein said epitaxially formed base for the bipolar transistor is p-type doped, particularly with boron, and contains germanium.

23. The method as claimed in claim 21, wherein an oxide is grown or deposited on the structure obtained subsequent to etching.

24. A method in the manufacture of a bipolar transistor having a self-registered base emitter structure, comprising the steps of:
forming a layer of amorphous silicon-germanium on a substrate of monocrystalline silicon or on a substrate at least comprising a surface layer of monocrystalline silicon,
depositing at least one dielectric layer on the amorphous silicon-germanium layer so as to prevent crystallization of the amorphous layer;
patterning the resultant structure, and etching the dielectric layer and the amorphous silicon-germanium layer within a predetermined region; and
heat-treating the resultant structure subsequent to etching so as to crystallize the amorphous layer,
wherein the substrate includes a buried collector and isolation regions for isolation of said bipolar transistor and where said predetermined region, within which the dielectric layer and the amorphous silicon-germanium layer are etched, defines an emitter opening for said bipolar transistor.

25. The method as claimed in claim 24, wherein an oxide is grown or deposited on the structure obtained subsequently to etching, and a base is formed by means of doping through the oxide.

26. The method as claimed in claim 24, wherein a layer of an electrically insulating material is deposited on the structure obtained subsequent to etching, whereafter the structure is etched an isotropically until a thin oxide layer remains on the substrate in the emitter opening and in such a manner that a spacer of said electrically insulating material remains along the sidewalls of the emitter opening.

27. The method as claimed in claim 26, wherein the electrically insulating material for forming the spacer is comprised of a nitride, which is deposited in a layer of a thickness of a couple of hundred nanometers by LP-CVD technique.

28. The method as claimed in claim 26, wherein an emitter contact is formed in the emitter opening and doped, whereafter the structure is heat-treated to form an emitter base junction in the substrate by means of diffusion of dopants from the emitter contact.

29. The method as claimed in claim 28, wherein the emitter contact is formed by depositing and doping a layer of polycrystalline silicon, whereafter the doped layer is patterned lithographically and plasma etched.

30. A method in the manufacture of an integrated circuit comprising at least a bipolar transistor and a resistor, comprising the steps of:
forming a layer of amorphous silicon-germanium on a substrate of monocrystalline silicon or on a substrate at least comprising a surface layer of monocrystalline silicon,
depositing at least one dielectric layer on the amorphous silicon-germanium layer so as to prevent crystallization of the amorphous layer;
patterning the resultant structure, and etching the dielectric layer and the amorphous silicon-germanium layer within a predetermined region; and
heat-treating the resultant structure subsequent to etching so as to crystallize the amorphous layer,
wherein the substrate includes a buried collector and isolation regions for isolation of said bipolar transistor and where said predetermined region, within which the dielectric layer and the amorphous silicon-germanium layer are etched, defines an emitter opening for said bipolar transistor, and further comprising the step of:
depositing a silicon-germanium layer also on the isolation regions, whereby the patterning and etching steps comprise to simultaneously pattern and etch the silicon-germanium layer on top of the isolation regions in order to produce said resistor in the silicon-germanium layer.

31. A method for selective etching in the manufacture of a semiconductor device, comprising the steps of:
forming a layer of amorphous silicon-germanium on a substrate of monocrystalline silicon or on a substrate at least comprising a surface layer of monocrystalline silicon by deposition of silicon followed by implantation of germanium,
depositing at least one dielectric layer on the amorphous silicon-germanium layer so as to prevent crystallization of the amorphous layer;
patterning the resultant structure, and etching the dielectric layer and the amorphous silicon-germanium layer within a predetermined region; and
heat-treating the resultant structure subsequent to etching so as to crystallize the amorphous layer.

* * * * *